(12) United States Patent
Okamoto et al.

(10) Patent No.: US 8,974,116 B2
(45) Date of Patent: Mar. 10, 2015

(54) HEAT SINK FOR MEASURING TEMPERATURE OF ELECTRONIC COMPONENT

(75) Inventors: Tomomi Okamoto, Kawasaki (JP); Hiroshi Yamada, Kawasaki (JP); Ryuji Ito, Kawasaki (JP); Osamu Higashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 867 days.

(21) Appl. No.: 12/730,811

(22) Filed: Mar. 24, 2010

(65) Prior Publication Data

US 2010/0254426 A1 Oct. 7, 2010

(30) Foreign Application Priority Data

Mar. 27, 2009 (JP) ................................. 2009-079985

(51) Int. Cl.

| G01K 17/00 | (2006.01) |
|---|---|
| G01K 1/00 | (2006.01) |
| G01K 7/00 | (2006.01) |
| G01K 13/00 | (2006.01) |
| G01K 1/14 | (2006.01) |
| H01L 23/34 | (2006.01) |

(52) U.S. Cl.
CPC ........ *G01K 1/14* (2013.01); *H01L 23/34* (2013.01); *H01L 2924/0002* (2013.01)
USPC ............. 374/29; 374/141; 374/163; 374/208; 361/690; 361/709

(58) Field of Classification Search
USPC ............. 374/29, 141, 163, 208; 361/690, 709
See application file for complete search history.

(56) References Cited

U.S. PATENT DOCUMENTS

| 5,006,796 | A | * | 4/1991 | Burton et al. ............. 324/750.11 |
|---|---|---|---|---|
| 5,875,096 | A | * | 2/1999 | Gates ............................ 361/704 |
| 2003/0227067 | A1 | * | 12/2003 | Wienand et al. .............. 257/467 |
| 2006/0013281 | A1 | * | 1/2006 | Sri-Jayantha et al. ........ 374/163 |
| 2006/0255822 | A1 | * | 11/2006 | Saito et al. .................... 324/760 |
| 2009/0024345 | A1 | * | 1/2009 | Prautzsch ........................ 702/99 |
| 2009/0210190 | A1 | * | 8/2009 | Carlson et al. ................ 702/130 |
| 2009/0232186 | A1 | * | 9/2009 | Li et al. ......................... 374/208 |
| 2010/0103624 | A1 | * | 4/2010 | Chen et al. .................... 361/710 |
| 2010/0328897 | A1 | * | 12/2010 | Ma et al. ........................ 361/709 |
| 2014/0036445 | A1 | * | 2/2014 | Okamoto et al. ............. 361/697 |

FOREIGN PATENT DOCUMENTS

| JP | 2003-234440 | 8/2003 |
|---|---|---|
| JP | 2007-234753 | 9/2007 |
| JP | 2007-234950 | 9/2007 |

OTHER PUBLICATIONS

Japanese Notification of Reasons for Refusal dated Feb. 12, 2013 in Japanese Application 2009-079985.

* cited by examiner

*Primary Examiner* — Mirellys Jagan
(74) *Attorney, Agent, or Firm* — Staas & Halsey LLP

(57) ABSTRACT

There is provided a heat sink for measuring temperature of electronic component. The heat sink includes a heat radiating plate, a fin, a heat receiving plate, and a temperature detector. The heat radiating plate has a first surface that receives heat from the electronic component. The fin is for radiating heat energy conducting through the heat radiating plate and is connected to the heat radiating plate. The heat receiving plate arranged apart from the heat radiating plate has a second surface movable to be parallel to the first surface. The temperature detector that detects a temperature is disposed on the heat receiving plate.

8 Claims, 20 Drawing Sheets

HEAT SINK FOR MEASURING TEMPERATURE OF ELECTRONIC COMPONENT

CROSS-REFERENCE TO RELATED APPLICATION

This application is based upon and claims the benefit of priority of the prior Japanese Patent Application No. 2009-079985, filed on Mar. 27, 2009, the entire contents of which are incorporated herein by reference.

FIELD

The embodiments discussed herein are related to a heat sink used for, measuring temperature of electronic component.

BACKGROUND

Hereinafter a chip package is referred to as a package including within, for example, an integrated circuit such as a large scale integrated circuit (LSI). As is well known, various kinds of test are applied to a product or prototype for evaluating its performances such as performance depending on temperature. In case of temperature test of an LSI chip package, the LSI chip package is connected to a printed circuit board (PCB) or a print wiring board (PWB) via socket(s) and a heat sink is disposed on the LSI package. A temperature-detecting element such as thermistor(s) for sensing temperature is mounted on the heat sink. When the LSI chip package is energizes for operation, the LSI chip package develops heat. And heat energy of the LSI chip package is conducted to the heat sink. The heat energy is radiated in the air from a fin of the heat sink. Accordingly, in this manner, the temperature of the LSI chip package is lowered.

A fan attached to the heat sink generates an air stream along the fin of the heat sink. The more air volume of the air stream is increased, the more radiation efficiency of the heat energy of the heat ink is improved. As a result, the radiation efficiency of the heat of the heat sink is adjusted by controlling the air volume of the air stream. During conducting a temperature test, the air volume of the air stream is controlled according to output data corresponding to the temperature measured by the thermistor. As a result, the temperature of the LSI chip package is set to a specific temperature or the around the temperature. And then, operation check all over the LSI chip package is executed.

Detecting the temperature of the LSI chip package via the heat sink, the thermistor is mounted on the heat sink as described above. Since heat energy of the LSI chip package is conducted to the heat sink and the heat energy is radiated in the air from the heat sink, the temperature of the heat sink is lowered than the actual temperature of the energized LSI chip package. Accordingly, the thermistor cannot accurately detect the actual temperature of the LSI chip package, which may introduce inaccuracy of the temperature test.

[Patent Document 1] Japanese Laid-open Patent Publications No. 2007-234753
[Patent Document 2] Japanese Laid-open Patent Publications No. 2003-234440

SUMMARY

According to an aspect of the invention, a heat sink includes: a heat radiating plate having a first surface that receives heat from the electronic component; a fin connected to heat radiating plate, and radiates heat energy conducting through the heat radiating plate, connected to the heat radiating plate; a heat receiving plate arranged apart from the heat radiating plate and having a second surface movable to be parallel to the first surface; and a temperature detector that detects a temperature and disposed on the heat receiving plate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, an embodiment of a heat sink will be described with reference to the accompanying drawings.

Figure 1:
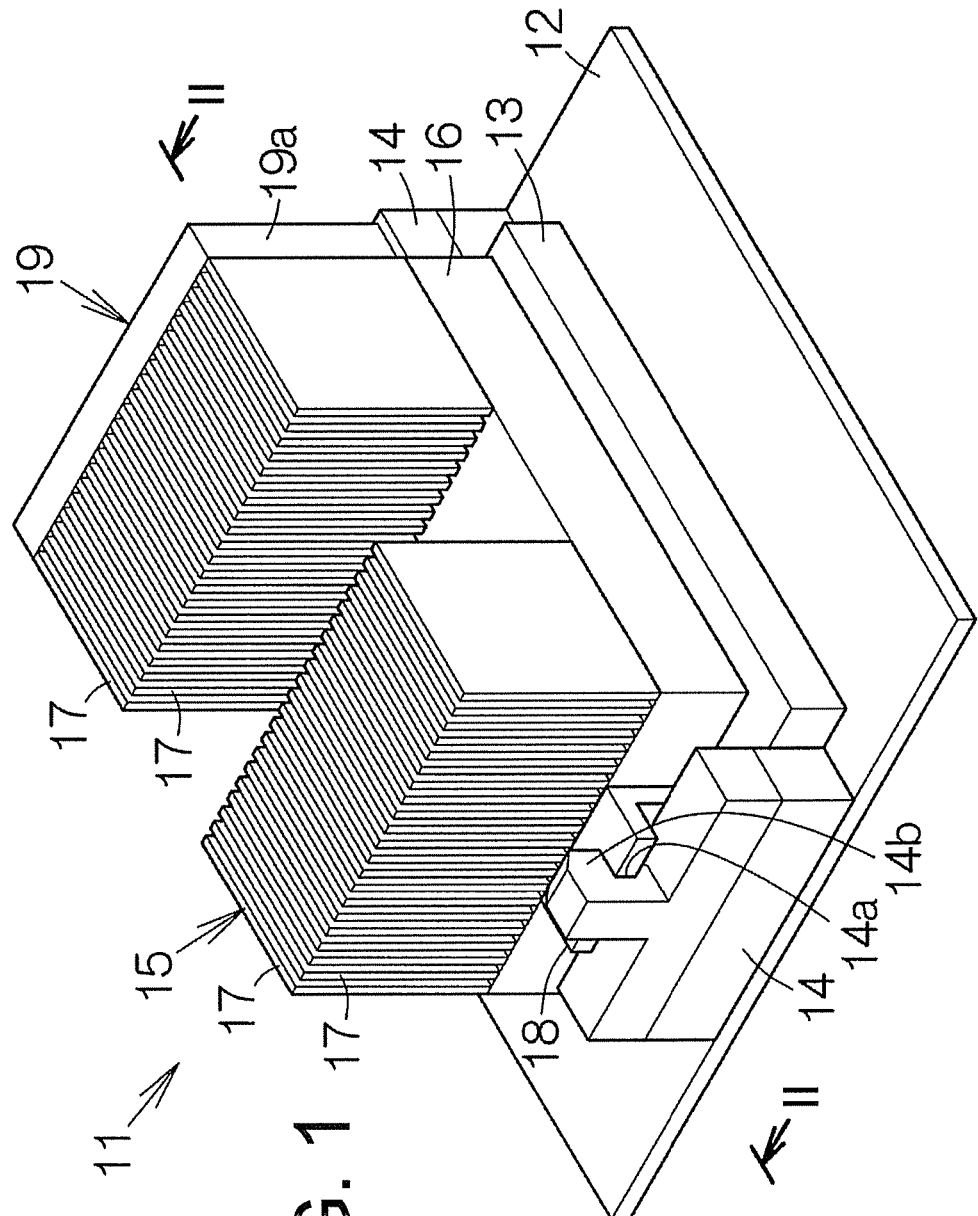
FIG. 1 is a perspective view schematically illustrating the structure of a temperature testing device according to an embodiment.

FIG. 1 is a diagram schematically illustrating the structure of a temperature-testing device 11 according to an embodiment. The temperature-testing device 11 is equipped with a print wiring board or a printed circuit board 12. For example, a resin substrate or the like is used for the printed circuit board 12. A socket 13 is attached on a face of the printed circuit board 12. The socket 13 is formed to have a flat rectangular solid shape or a rectangular plate. A pair of attachment members 14 rise from the face of the printed circuit board 12 outside the socket 13. A heat sink 15 in a horizontal posture is supported by the attachment members 14 and disposed above the socket 13. The attachment member 14 is made of, for example, a metal material.

The heat sink 15 is equipped with a radiator plate 16 spreading in parallel with the face of the printed circuit board 12. A lower face of the radiator plate 16 faces the upper face of the socket 13 as illustrated in FIG. 1. A plurality of fins 17 are firmly fixed to the radiator plate 16 and each of the fins 17 rises in the vertical direction from the face of the radiator plate 16. The fins 17 are arranged so as to be in parallel to each other. Accordingly, a plurality of air passages extending in a same direction are partitioned or defined between the adjacent fins 17. At both ends of the radiator plate 16, protruding pieces 18 are formed so as to protrude in opposite directions to each other from side faces of the radiator plate 16, where one of pieces 18 behind a fun unit 19 is not illustrated in FIG. 1. The radiator plate 16, the fins 17, and the protruding pieces 18 are made of heat conductive material such as aluminum, copper, or the like.

Each of the protruding pieces 18 engages with or interlocks with a cutout 14a formed at an inner end of the attachment member 14 individually. The upper face of the protruding piece 18 has contact with a claw 14b of the attachment member 14 when the protruding pieces 18 engage with the cutout 14a. Since the claws 14b are capable of elastically deforming at engaging with the protruding pieces 18, the heat sink 15 may be set to and released from the attachment members 14. The fan unit 19 is attached at an end of the heat sink 15 as illustrated in FIG. 1. A fan or an air blower (not depicted) is arranged within a housing 19a of the fan unit 19 for generating an air circulation along interspaces between the fins 17. It is also preferable for the fan unit 19 to be disposed on or fixed to, for example, the printed circuit board 12.

Figure 2:
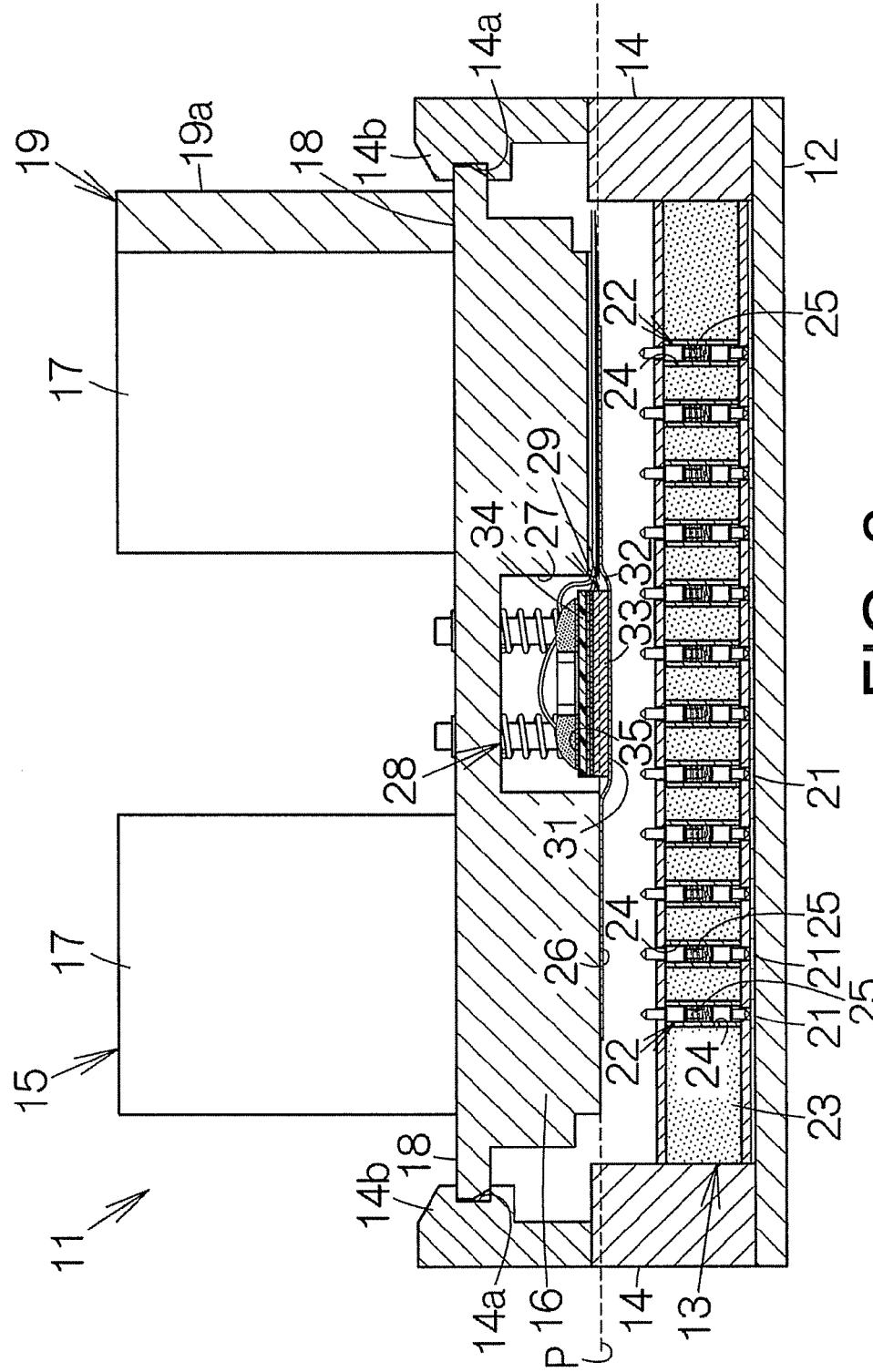
FIG. 2 is a cross sectional view taken along the line II-II of FIG. 1.

FIG. 2 is a diagram schematically illustrating the structure of the heat sink 15 according to the first embodiment. Conductive pads 21 are disposed in a matrix manner on the surface of the printed circuit board 12. A plurality of detection probes 22 are arranged within the socket 13. An end of each of the detection probes 22 has contact with each of the conductive pads 21 one for one. The detection probe 22 corresponds to the conductive pad 21 to be one to one. The socket 13 includes a socket main body 23 having a flat rectangular solid shape. The socket main body 23 has through-holes 24 penetrating from the upper to lower surfaces thereof. Each of the detection probes 22 is disposed in the respective through-hole 24 and the detection probes 22 are capable to move orthogonally to the printed circuit board 12. The detection probe 22 protrudes from the upper and lower surfaces of the socket main body 23, since an elastic force caused with an elastic member, for example, such as a coil spring 25 is applied to the individual detection probe 22. An end of the detection probe 22 is pressed to the conductive pad 21 by the operation of the elastic force.

The lower surface of the radiator plate 16 defines a contact face 26 spreading along a plane P. The contact face 26 is a flat face. Further the contact face 26 spreads in parallel to the surface of the printed circuit board 12. The outline of the contact face 26 is set larger than the outline of a face of an LSI chip package which is disposed on the face of the socket main body 23 and described below. A recess 27 dents from the plane P of the radiator plate 16 is formed on the lower surface of the radiator plate 1. The recess 27 is opened toward the upper surface of the socket main body 23. The contact face 26 spreads continuously around the recess 27. The center of the recess 27 in FIG. 2 coincides approximately with, for example, the crossing point of the diagonal lines of the outline of the contact face 26 on the radiator plate 16.

The heat sink 15 includes a temperature detection unit 28 disposed in the recess 27. The temperature detection unit 28 is equipped with a heat receiving plate 29 disposed in the opening of the recess 27. A predetermined gap is formed between an outer rim of the heat receiving plate 29 and an inner wall surface of the recess 27. The heat receiving plate 29 has a heat-receiving surface 31 which is separated from the contact face 26 and spreaded in parallel with the plane P. A heat transfer sheet 32 having high heat conductivity is formed on the heat-receiving surface 31 so as to close the opening of the recess 27. The heat transfer sheet 32 is made of, for example, an aluminum foil. A thermal compound is sandwiched between the heat transfer sheet 32 and the heat-receiving surface 31, and between the heat transfer sheet 32 and the contact face 26 for example. The outline of the heat transfer sheet 32 is set larger than the outline of a surface of an LSI chip package described below.

Figure 3:
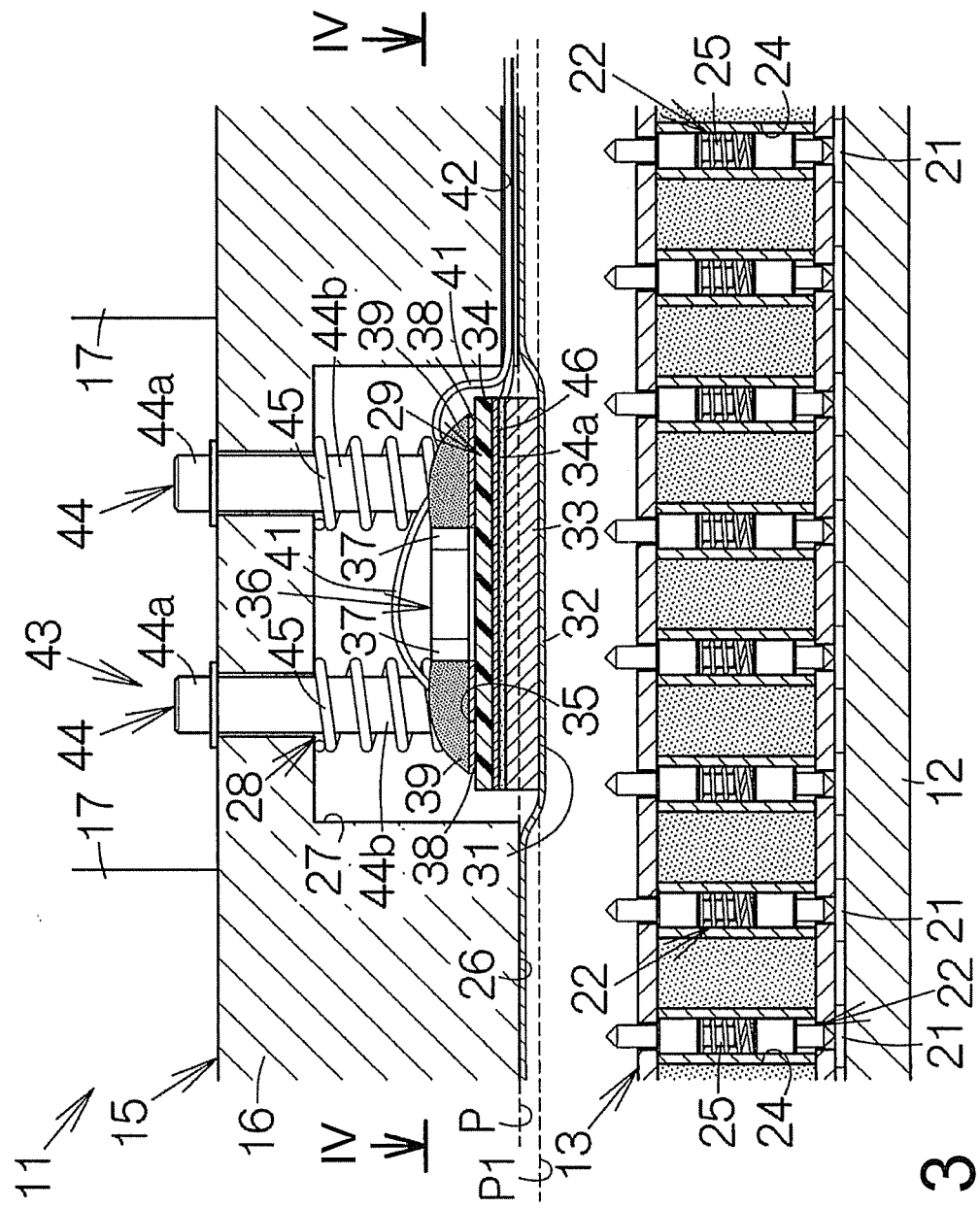
FIG. 3 is a partial enlarged cross sectional view of FIG. 2.

In conjunction with FIG. 3, the heat receiving plate 29 is equipped with a metal plate 33 which defines the heat-receiving surface 31 at the lower surface thereof. The metal plate 33 is made of a heat conductive material such as an aluminum plate. The lower surface of a substrate 34 having an insulating property is overlapped with the face of the metal plate 33. The substrate 34 is made of, for example, a heat conductive material such as a resin plate and attached on the upper surface of the metal plate 33 by, for example, a joining material 34a having high heat conductivity. The joining material 34a is made of, for example, a thermally-conductive compound. The upper surface of the substrate 34 defines a support face 35 on or by which a temperature detecting element. A thermistor 36 is mounted on the support face 35.

Figure 4:
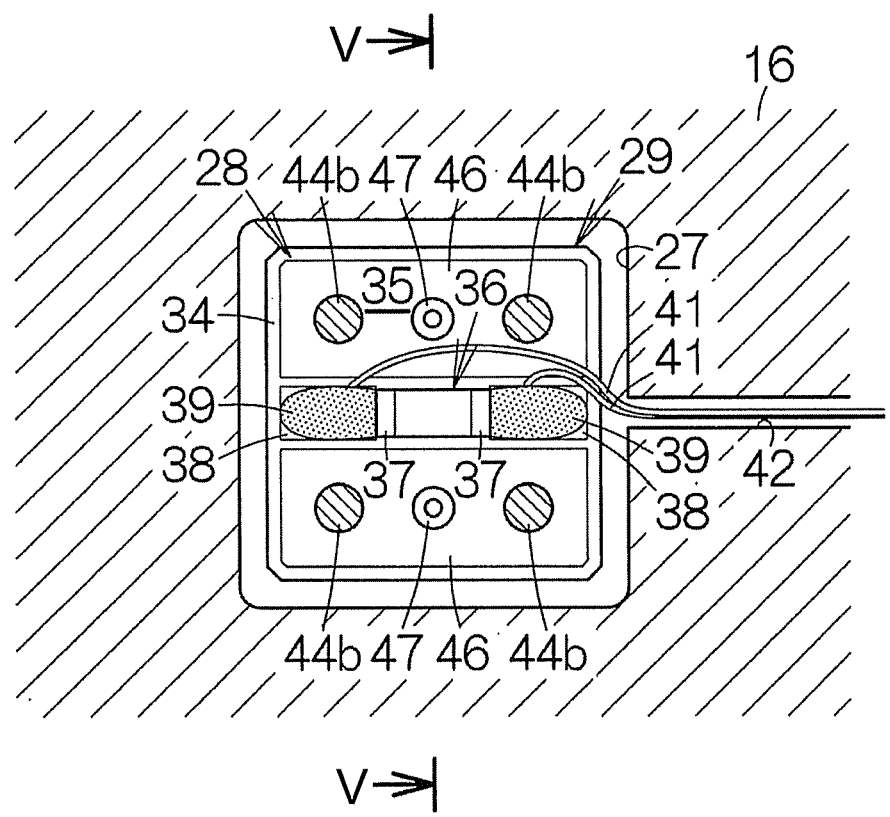
FIG. 4 is a partial enlarged cross sectional view taken along the line IV-IV of FIG. 3.

Referring to FIG. 4, the vicinity of the thermistor 36 will be explained. The therminstor 36 includes electrode terminals 37 at both ends. Temperature change causes, for example, a resistance change of the thermistor 36. Each of the electrode terminals 37 is electrically connected to one of a pair of conductive pads 38 respectively which are formed on the support face 35. The conductive pads 38 are made of, for example, a conductive material such as copper or the like, and are connected to the electrode terminals 37, for example, with solder materials 39. Each of electrical leads 41 is respectively wired to each of the solder materials 39. Each of the electrical leads 41 is connected to the corresponding one of the electrode terminals 37. For example, the electrical leads 41 are laid along within a groove 42 formed on the radiator plate 16 and are withdrawn outside the radiator plate 16. The groove 42 extends preferably to the outline of the radiator plate 16 from the recess 27. The electrical leads 41 are connected to a control circuit described below.

The heat receiving plate 29 is coupled with the radiator plate 16 in a displacement manner in the direction perpendicular to the plane P. The movement of the heat receiving plate 29 is allowed by a coupling mechanism 43 which is equipped with, for example, four bolts 44. The bolts 44, preferably made of metal material, are disposed to be adjacent to the four corners on the diagonal lines of the outline of the heat receiving plate 29. The heat receiving plate 29 is fixed to distal ends of the bolt 44 and displacement toward to the socket 13 of the plate 29 is regulated a regulation mechanism in which each head 44a of bolts 44 has portion larger in a diameter than that of hole corresponding to the bolt 44. Shafts 44b of the bolts 44 penetrate the radiator plate 16. The coupling mechanism 43 is equipped with elastic members such as coil springs 45 attached to each of the shafts 44b between the heat receiving plate 29 and the radiator plate 16. The coil springs 45 give an elastic force to keep the heat receiving plate 29 away from the radiator plate 16.

The heat-receiving surface 31 overlaps a plane P1 regulated by the lower surface of the plane P based on the elastic force of the coil spring 45. Displacement of the heat receiving plate 29 is regulated based on the head 44a at the position as described above. Since the support face 35 is disposed at the front or upper side of the plane P, the thermistor 36 is surrounded by the inner wall face of the recess 27. In this manner, an air layer or air space is formed between the support face 35 and the radiator plate 16, that is, the bottom face of the recess 27. Accordingly, the air layer is kept within a space formed with the support face 35 and the plate 16 and heat energy from the plate 16 to the heat receiving plate 29 is remarkably restrained from conducting or dissipating. In addition, since the opening of the recess 27 is shielded by the heat transfer sheet 32, air circulation between outside and inside of the recess 27 is almost blocked, or a space such like an air chamber is provided in the recess 27. As a result, the thermistor 36 may detect the temperature of the heat receiving plate 29 with a high accuracy.

Figure 5:
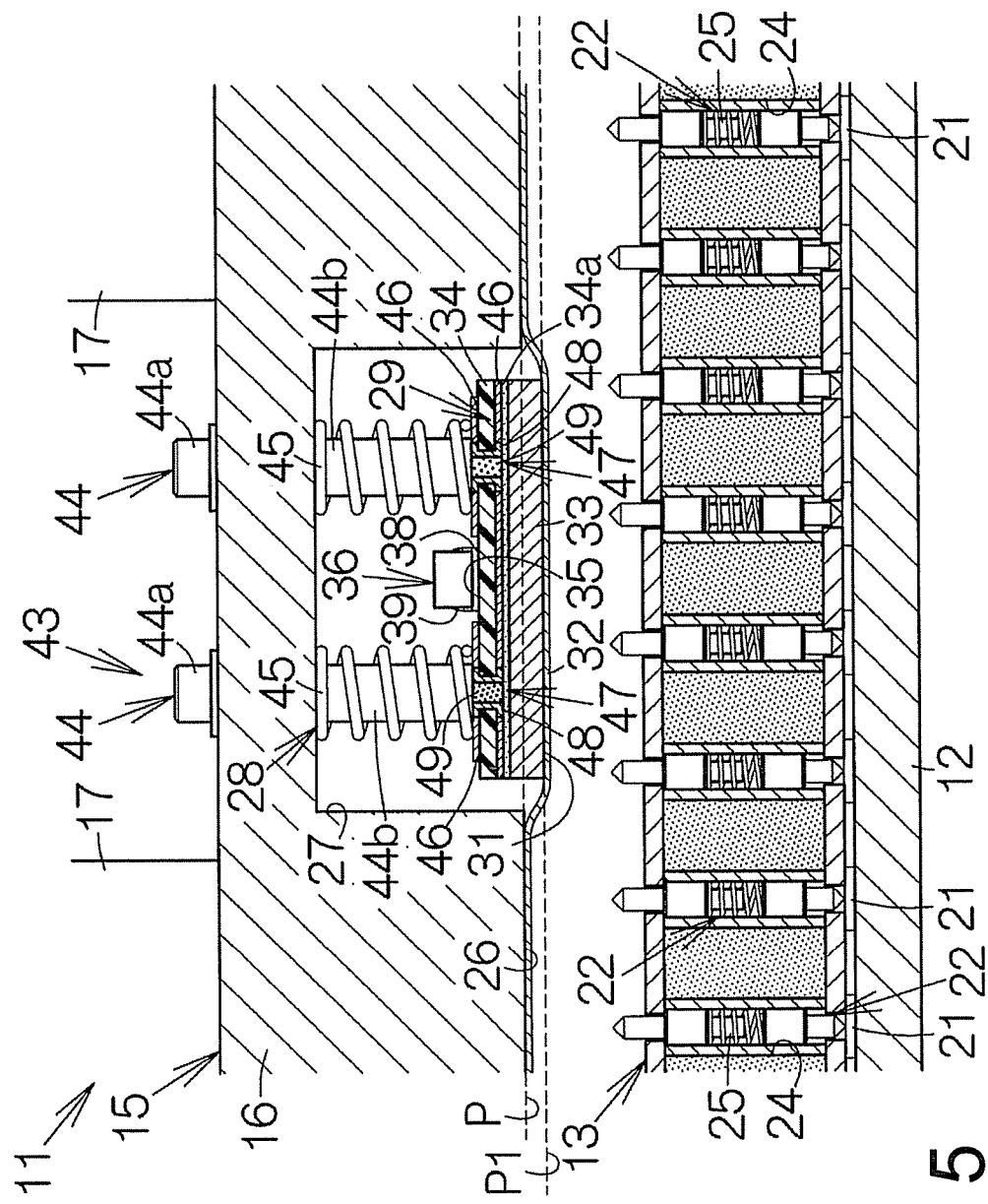
FIG. 5 is a cross sectional view taken along the line V-V of FIG. 4.

Referring to FIG. 5, detail around the recess 27 will be explained. Metal films 46 are formed on the upper and lower surfaces of the substrate 34. The metal film 46 is made of a metal material or a heat conductive material, for example, such as copper or the like. Through holes 47 are bored so as to penetrate between the upper and lower surfaces of the substrate 34. On an inner wall of each through-hole 47, a conductive wall 48 is provided so as to configure a cylindrical shape, for example, in which a conductive material 49 is filled. The conductive wall 48 and the conductive material 49 are made of a metal material or a heat conductive material, such as copper or the like. The conductive wall 48 and the conductive material 49 are connected to the metal films 46 at the upper and lower surfaces of the substrate 34. Accordingly, the through-holes 47 may facilitate the heat conduction between the upper and lower surfaces of the metal film 46 disposed on the upper and lower surfaces of the substrate 34.

As described above, the radiator plate 16, the fins 17, and the protruding pieces 18 of the heat sink 15 are made of a metal material. Each protruding piece 18 is coupled with each attachment member 14, which is made of a metal material. Since the heat receiving plate 29 is separated from the radiator plate 16 as described above, the radiator plate 16, the fins 17, the protruding pieces 18, and the attachment members 14 may also function as an electromagnetic shield of the temperature detection unit 28. Accordingly, even when, for example, a noise such as an electromagnetic wave is operated to the heat sink 15, the thermistor 36 may operates normally.

Figure 6:
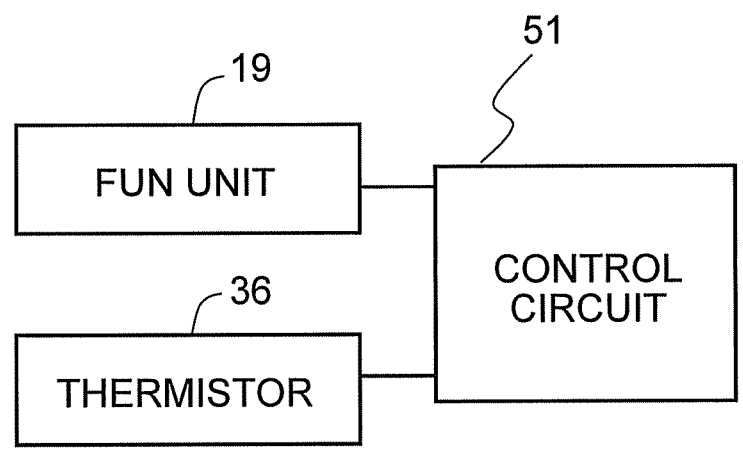
FIG. 6 is a block diagram illustrating a control system of the temperature testing device.

FIG. 6 is a diagram illustrating a control system of the temperature testing device 11. The temperature testing device 11 is equipped with a control circuit 51. The fan unit 19 and the thermistor 36 are connected to the control circuit 51. Temperature information is output to the control circuit 51 from the thermistor 36. The control circuit 51 controls the operation of the fan unit 19 based on the temperature information. Based on a control signal supplied form the control circuit 51, the rotation number of the fan in the fan unit 19 is adjusted in the fan unit 19. In this manner, the air volume outputted from the fan is controlled. It is also preferably to switch the fan in the fan unit 19 on or off based on a control signal. The operation of the control circuit 51 is executed based on, for example, a predetermined software program.

Figure 7:
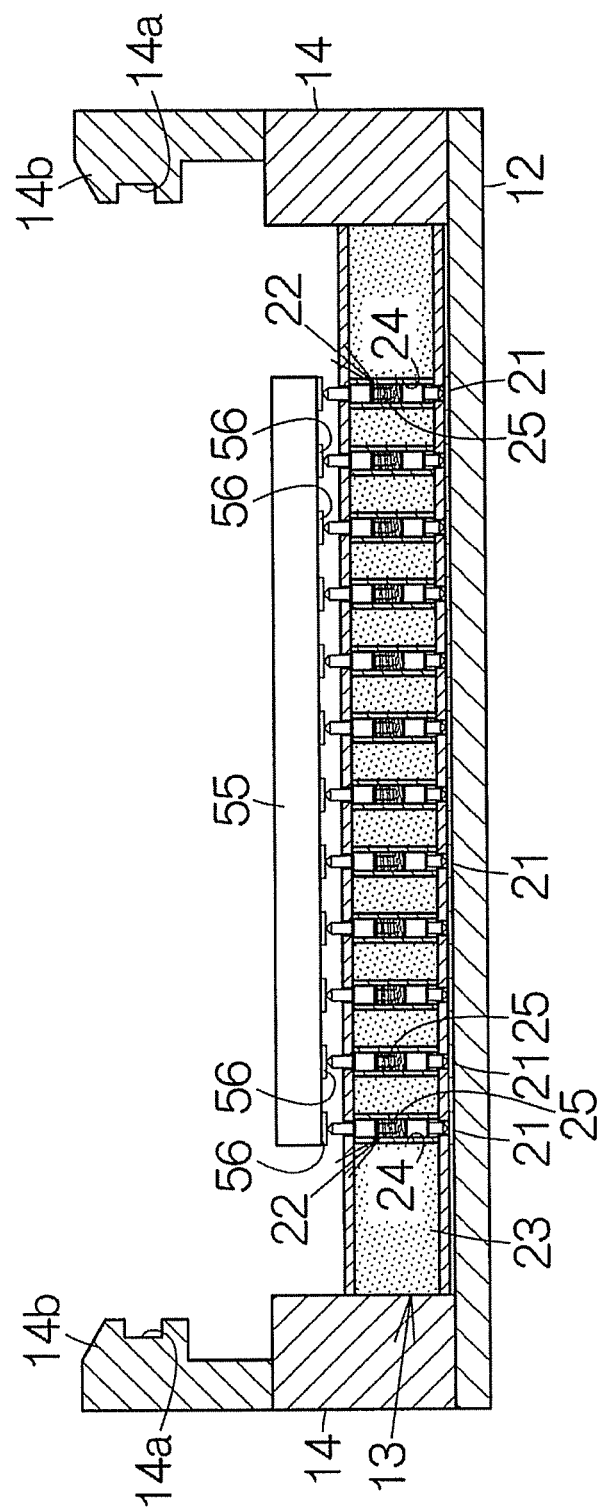
FIG. 7 is a cross sectional view schematically illustrating an appearance in which an LSI (Large Scale Integrated circuit) chip package is disposed on a socket.

Referring to FIGS. 7 to 11, temperature testing device 11 executes a temperature test for a semiconductor package such as an LSI chip package will be explained. FIG. 7 depicts lower part of the temperature testing device 11 prior to setting the heat sink 15 thereon. At the time, an LSI chip package 55 to be tested is attached on the socket 13. Each of the ends of the detection probes 22 contacts each of receive conductive pads 56 disposed in a matrix on the lower surface of the LSI package 55. The conductive pads 56 correspond one to one with the conductive pads 21 on the printed circuit board 12. The ends of the probes 22 are pressed to the conductive pads 56 of the LSI chip package 55 by the elastic force of the coil springs 25.

Figure 8:
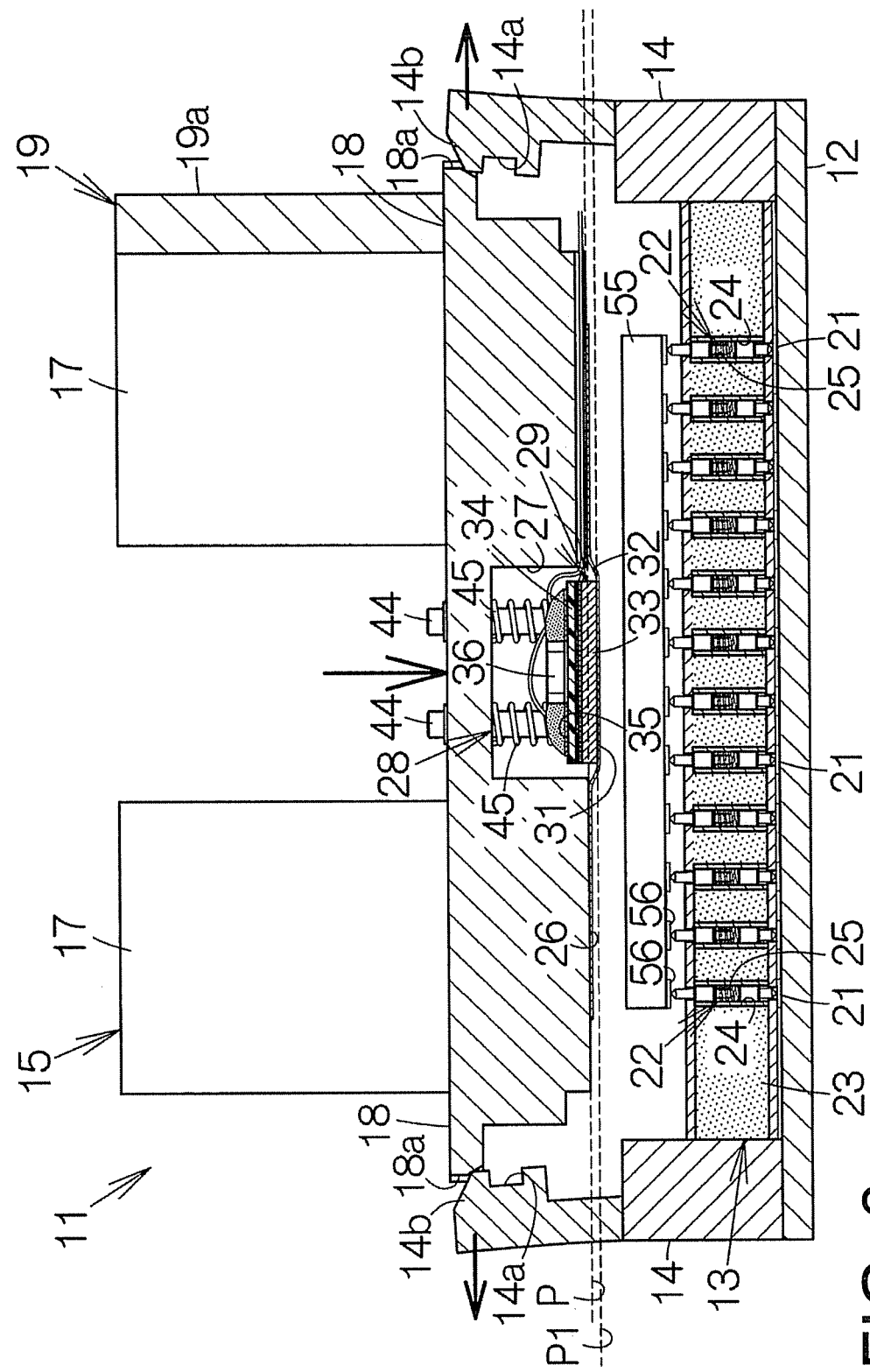
FIG. 8 is a cross sectional view schematically illustrating an appearance in which a heat sink is attached on the printed circuit board.

As depicted in FIG. 8, the heat sink 15 is attached or set on the lower part of the temperature testing device 11 including the printed circuit board 12. Then each cutout 18a formed at an outer end of each protruding piece 18 of the heat sink 15 is applied to the claw 14b of the attachment member 14, and the radiator plate 16 is pressed toward the printed circuit board 12. As a result, the attachment members 14 are elastically deformed in the direction so as to be separated to each other. By pressing the radiator plate 16 further, the protruding piece 18 is received in the cutout 14a of the attachment member 14. When the attachment member 14 returns to the original shape, the claw 14b of the attachment member 14 is received on the upper face of the protruding piece 18. In this manner, the heat sink 15 is attached or set to the attachment member 14 or the lower part of the temperature testing device 11 as illustrated in FIG. 9.

Figure 9:
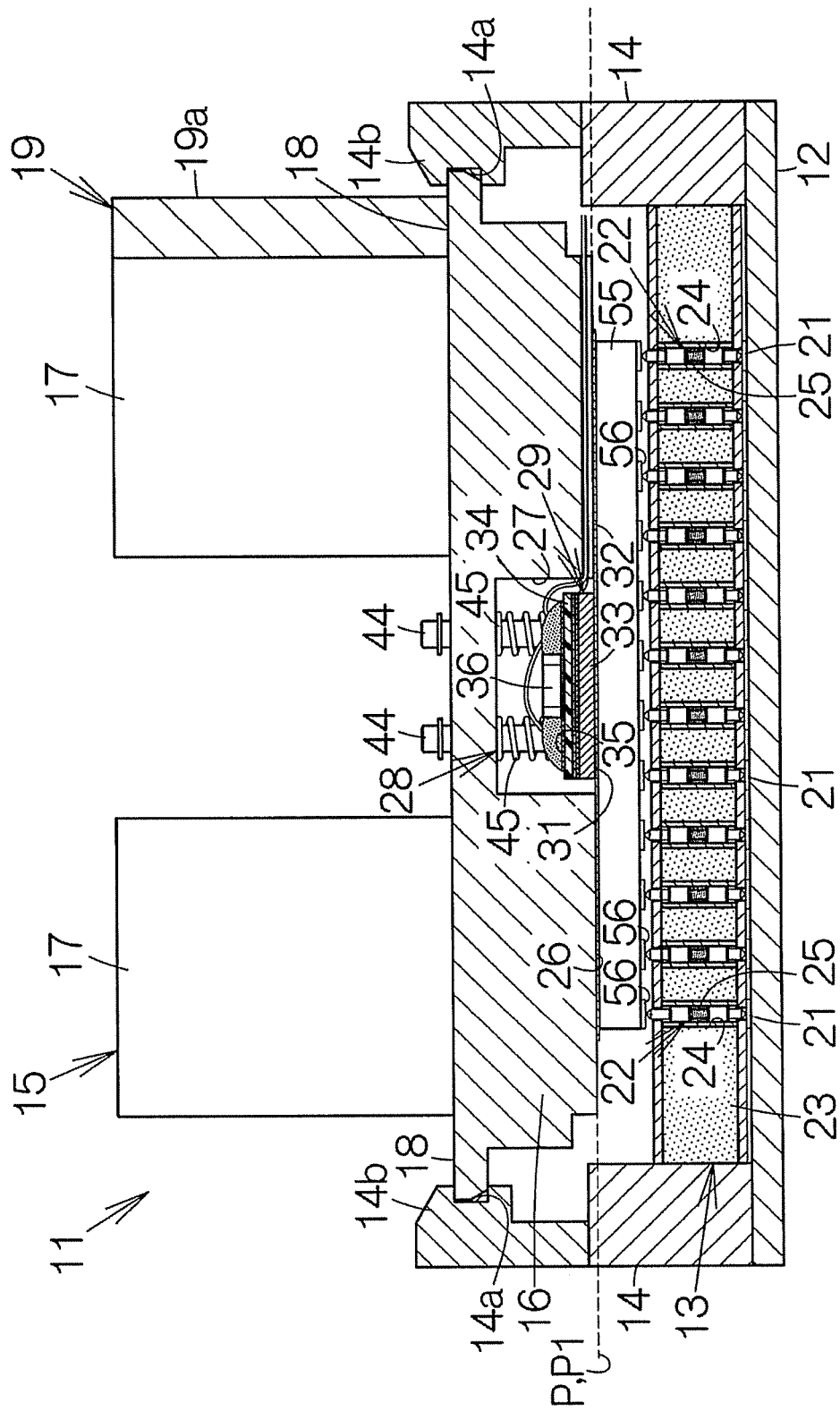
FIG. 9 is a cross sectional view schematically illustrating an appearance in which the heat sink is attached on the printed circuit board.

The above described arrangement may facilitate a close mechanical contact between the contact face 26 of the radiator plate 16 and the surface of the LSI chip package 55, and the heat-receiving surface 31 of the heat receiving plate 29 and the surface of the LSI chip package 55 as illustrated in FIG. 9. At the same time, one ends of the detection probes 22 presses the LSI chip package 55 toward the heat sink 15 by the elastic force of the coil springs 25 arranged within the socket 13. Accordingly, the heat receiving plate 29 is aligned on the upper surface of the plane P. The heat-receiving surface 31 overlaps the plane P. That is, the plane P1 overlaps the plane P. At the time, the coil spring 45 operates the elastic force for deforming the heat-receiving surface 31 from the upper surface side to the lower surface of the plane P, that is, to the surface of the LSI chip package 55.

The spring constant of the coil spring 45 is designed with the thickness of the LSI chip package 55 in mind. When the LSI chip package 55 having the maximum thickness among test targets is measured, the constant of each constant of springs 45 is designed so that the pressing force operating on the surface of the LSI chip package 55 from the heat-receiving surface 31 is preferably equal to or close to the pressing force operating on the surface of the LSI chip package 55 from the contact face 26. Since the pressing force of the contact face 26 may be equal to the pressing force of operating to the LSI chip package 55 from the one ends of the detection probes 22, the constant of spring of the coil spring 45 is set so that the pressing force of the heat-receiving surface 31 and the pressing force of the socket 13 are equal. As a result, even when the thickness of the LSI chip package 55 is reduced from the maximum thickness, the pressing force of the heat-receiving surface 31 is kept at a constant value. Regardless of change of the thickness of the LSI chip package 55, a constant heat thermal resistance is constantly established between the heat-receiving surface 31 and the LSI chip package 55.

Figure 10:
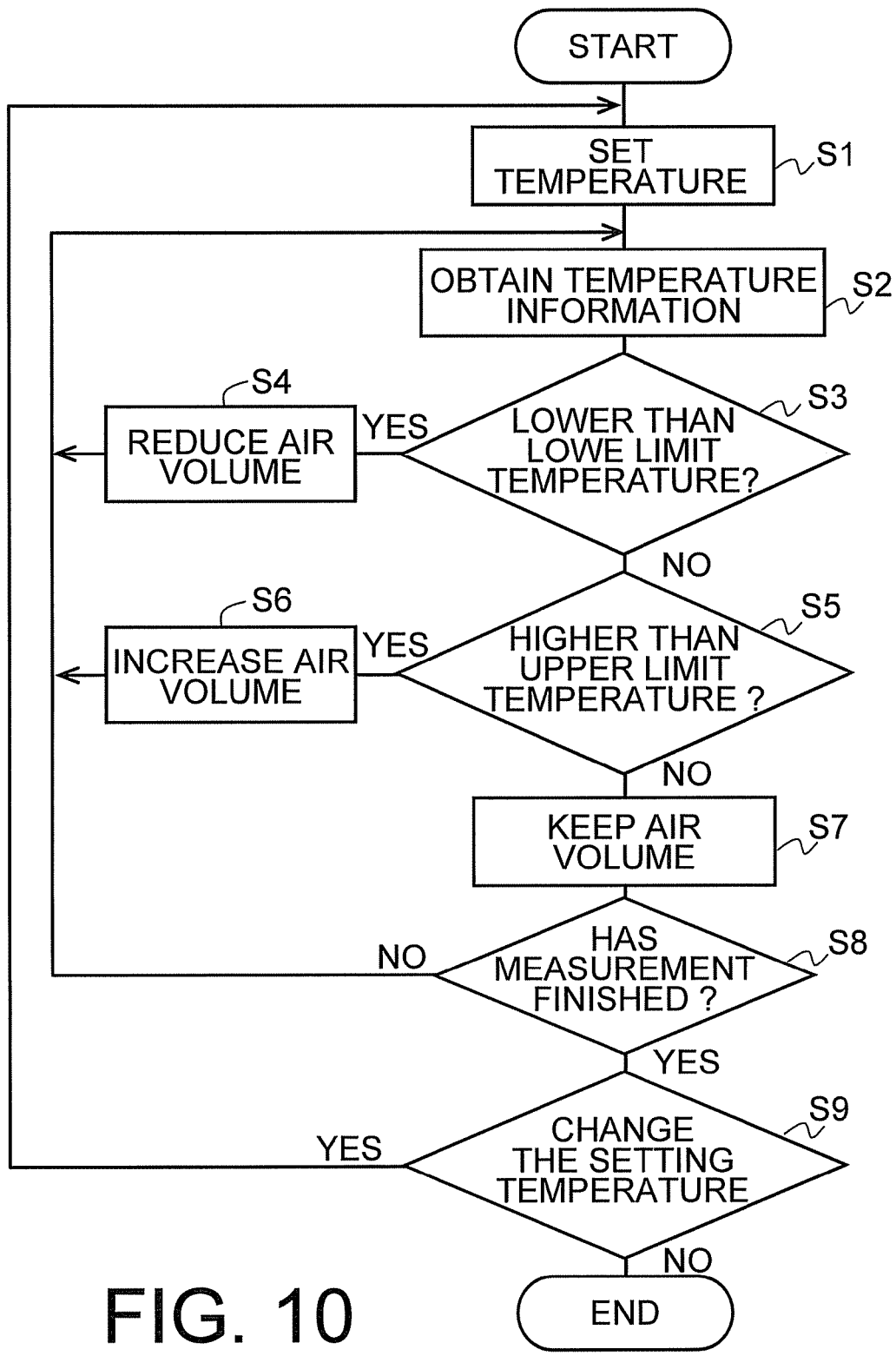
FIG. 10 is a flowchart illustrating a processing flow of a control circuit.

Prior to a temperature test, a driving current is supplied to the LSI chip package 55 to operate a circuit or circuits in the LSI package 55. The LSI chip package 55 is heated while operation. At the same time, a driving current is supplied to the fan unit 19. The fan generates an air stream of a predetermined air volume. FIG. 10 is a flow chart illustrating the flow of a processing of the control circuit 51. Setting temperature of the LSI chip package 55 is set in step S1 by the control circuit 51 or manually through the control circuit 51. The set temperature is set at, for example, 70° C. In the temperature test, property of the LSI chip package 55 is usually or mainly verified at the setting temperature. Herein, the setting temperature has a predetermined acceptable range which defines a lower limit temperature and an upper limit temperature within a temperature width around the setting temperature.

For explaining the following steps in FIG. 10, the conduction mechanism of the heat or heat energy generated by the LSI 55 will be explained. Since the surface of the LSI chip package 55 contacts the contact face 26 and the heat-receiving surface 31, the heat energy of the LSI chip package 55 is conducted from the contact face 26 and the heat-receiving surface 31 to the radiator plate 16 and the heat receiving plate 29. The heat energy is radiated to the air from the fins 17 via the radiator plate, 16. On the other hand, the heat energy is conducted to the substrate 34 from the metal plate 33. The heat energy is transmitted to the metal film 46 on the upper side surface of the substrate 34 from the metal film 46 on the lower side surface of the substrate 34. At the time, conduction efficiency of the heat energy is improved by the operation of the through-holes 47 depicted in detail in FIG. 5. Accordingly, the temperature of support face 35 of the substrate 34 is raised, which causes a resistance change in the thermistor 36. The thermistor 36 outputs temperature information to the control circuit 51.

Figure 11:
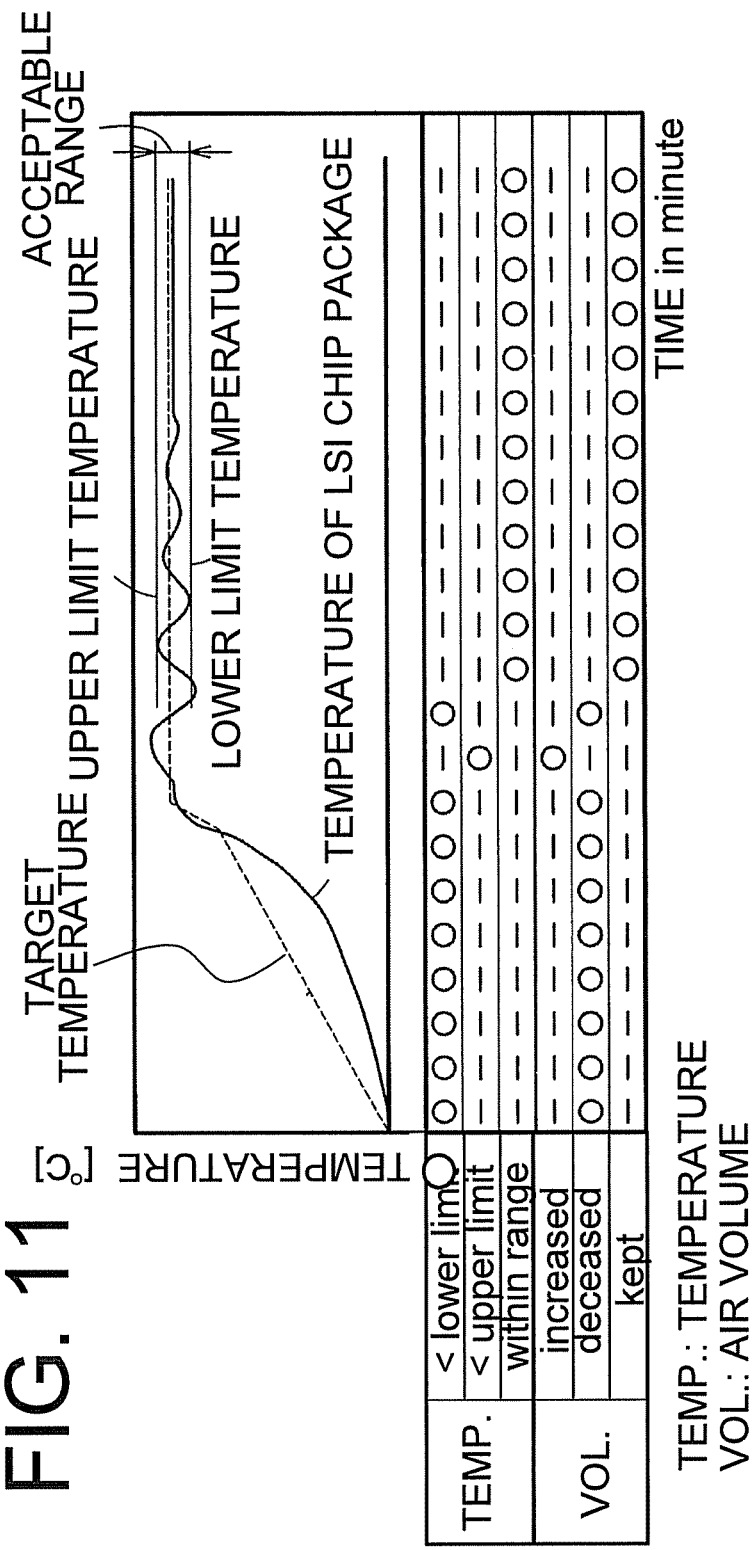
FIG. 11 is a graph and a chart illustrating the processing flow of the control circuit.

Now returning to FIG. 10, the control circuit 51 obtains temperature information outputted from the thermistor 36 in step S2. In S3, the control circuit 51 compares the temperature information outputted from the thermistor 36 with the lower limit temperature information. When the temperature information outputted is lower than the lower limit temperature information, the control circuit 51 reduces the air volume of the fan by one level in step S4. As illustrated in FIG. 11, in the initial step of the operation of the LSI chip package 55, the air volume of the fan is reduced since a temperature lower than the lower limit temperature is detected. Accordingly, the radiation efficiency of the heat energy of the fins 17 is lowered. Returning to FIG. 9, the processing goes back to step S2 after the processing in S4. The control circuit 51 obtains temperature information from the thermistor 36 at, for example, one minutes interval. In this manner, as a result of repeating the processing of step S2 to S4, the temperature of the LSI chip package 55 may be raised.

When the temperature of the LSI chip package 55 exceeds the lower limit temperature, the process proceeds to step S5. The control circuit 51 compares the temperature information from the thermistor 36 with the upper limit temperature information. When the temperature information from the thermistor 36 exceeds the upper limit temperature information, the control circuit 51 increases the air volume of the fan by one level in step S6. The radiation efficiency of the heat energy of the fins 17 may be improved. Accordingly, the LSI chip package 55 may be cooled, and then the temperature of the LSI chip package 55 may be lowered. As illustrated in FIG. 10, the processing goes back to step S2 after S6 is operated. As a result the processing of steps S2 to S6 may be repeated.

On the other hand, when the temperature information from the thermistor 36 falls below the upper limit temperature information, it is judged that the temperature is within the acceptable range (S5, No). Then, the air volume is kept as it is (S7), and the process proceeds to step S8. As far as the temperature is kept in the acceptable range, the control circuit 51 intends to keep the air volume of the fan in step S7. Under this situation, the property or performance of the LSI chip package 55 is verified. In processing in FIG. 10, the completion of the measure is determined in S8. When the verifying of the property is not finished, the processing retunes to step S2. The processing of step S2 to S8 is repeated. When verifying of the property is finished (S8, Yes), the processing proceeds to step S9 in which the control circuit 51 determines whether to change of the setting temperature of the LSI chip package 55. When it is judged that it is desired to newly set the setting temperature for verification of the performance of the LSI chip package 55 (YES in S9), the processing goes back to step S1. On the other hand, when it is judged that it is not necessary to newly set the setting temperature (NO in S9), the processing is finished.

In the temperature testing device 11, the heat sink 15 is received by the LSI chip package 55 by the contact face 26 of the heat radiator plate 16 and the heat-receiving surface 31 of the heat receiving plate 29. The heat energy of the LSI chip package 55 is conducted to the radiator plate 16 from the contact face 26 and the heat energy is radiated to the air from the fins 17. In this manner, the LSI chip package 55 is cooled. At the same time, the heat energy of the LSI chip package 55 is conducted to the heat receiving plate 29 from the heat-receiving surface 31. Since the heat-receiving surface 31 is separated from the contact face 26, the heat energy of the LSI chip package 55 is effectively conducted to the thermistor 36. The thermistor 36 may detect the temperature of the LSI chip package 55 with a high accuracy.

Figure 12:
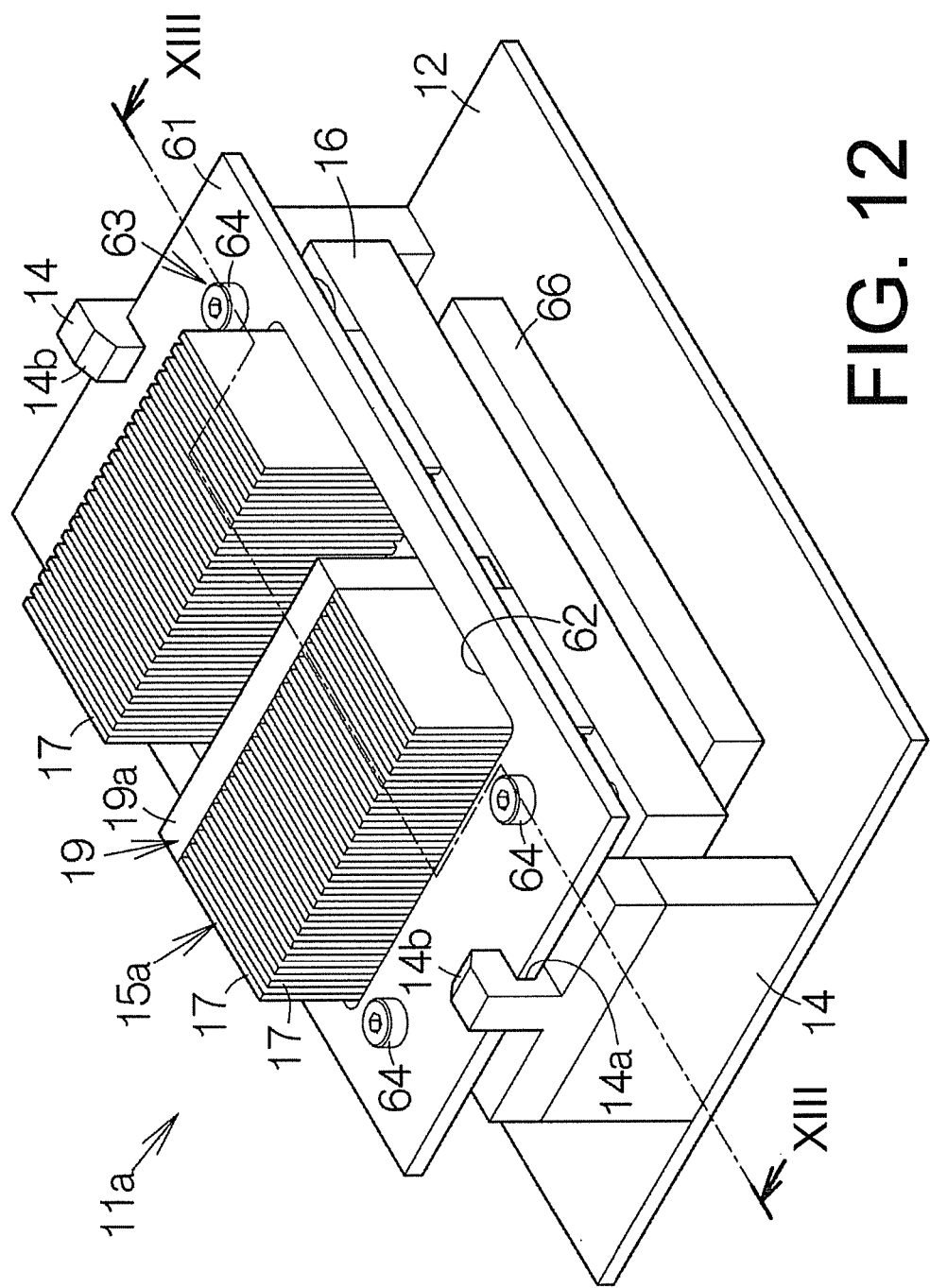
FIG. 12 is a perspective view schematically illustrating a temperature testing device according to another concrete example.

FIG. 12 is a diagram schematically illustrating the structure of a temperature testing device 11a including a heat sink according to the second embodiment. For the clarity of the description, the same reference numeral is used to denote the same or similar element, part, configuration or structure as that n the first embodiment and the explanation thereof will be omitted. The temperature testing device 11a is equipped with a heat sink 15a. The heat sink 15a is equipped with a plate 61 spreading in parallel with the surface of the printed circuit board 12. The plate 61 is supported by the attachment members 14. An opening 62 is formed on the plate 61 and the fins 17 are disposed on the radiator plate 16 across the opening 62. The plate 61 is coupled with the radiator plate 16 with a coupling mechanism 63 which is equipped with, for example, four bolts 64, while only two bolts 64 are illustrated. The bolts 64 are disposed to be adjacent to the four corners on the diagonal lines on the surface of the radiator plate 16. A distal end of the bolt 64 is fixed to the radiator plate 16. The plate 61 and the bolt 64 are made preferably of a metal material.

Figure 13:
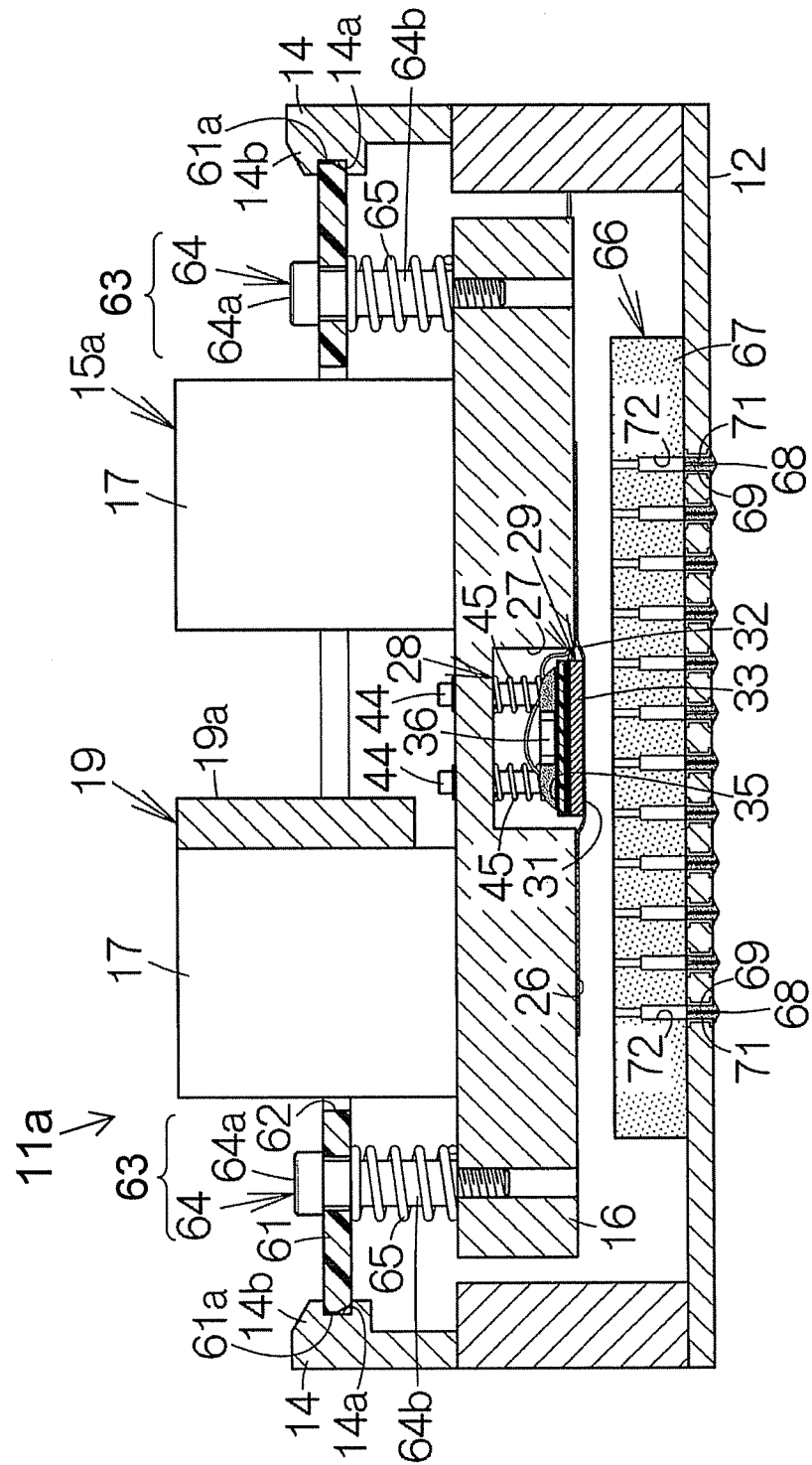
FIG. 13 is a cross sectional view taken along the line XIII-XIII of FIG. 12.

FIG. 13 is a cross-section diagram along the line XIII-XIII in FIG. 12 and illustrates schematically the structure of the heat sink 15a. Referring to 13, the heat sink 15a will be explained. Each of the bolts 64 has a head 64a at an end of bolt shank 64b and a screwed portion at the other end of the bolt shank 64b. The screwed portion has a smaller in diameter than that of the bolt shank. Each of the coupling mechanism 63 including the bolt 64 and an elastic member such as a coil spring 65. The bolt 64 passes through a through-hole provided to the plate 61 and the coil spring 65 as illustrated in FIG. 13. The screwed portion of the bolt 65 is screwed in a screw provided on the radiator plate 61. The coil spring 65 pushes the plate 61 away from the radiator plate 16. As illustrated in FIG. 13, the four coupling mechanisms 63 are disposed out of an area in which the fins 17 are arranged. Since the length of each bolt shank 64b are substantially same, the plate 61 and the radiator plate 16 are parallel each other. The plate 61 is connected or fixed to both of the attachment members 14 because the end of the plate 61 may be accepted individually by a groove or the cutout 14a provided at a sidewall of each of the attachment members 14. At the time, claws 14b of the attachment members 14 contact to the upper surface of the plate 61. In this manner, the heat sink 15a is attached through the plate 61 on the printed circuit board 12 in the horizontal posture.

Next, a socket 66 mounted on the printed circuit board 12 will be described. The socket 66 is equipped with a socket main body 67 having, for example, a flat rectangular solid shape or a rectangular plate shape. A plurality of terminal pines 68 are disposed in a matrix manner on the lower surface of the socket main body 67. The terminal pines 68 protrude from the lower surface of the socket main body 67 and forms an arrangement as a pin grid array. Each of the terminal pins 68 is secured to a through-hole 69 formed on the printed circuit board 12 by a solider material 71. The upper surface or face of the socket main body 67 faces the contact face 26 and the heat-receiving surface 31. A plurality of through-holes 72 individually corresponding to each of the terminal pins 68 are formed on the socket main body 67.

Figure 14:
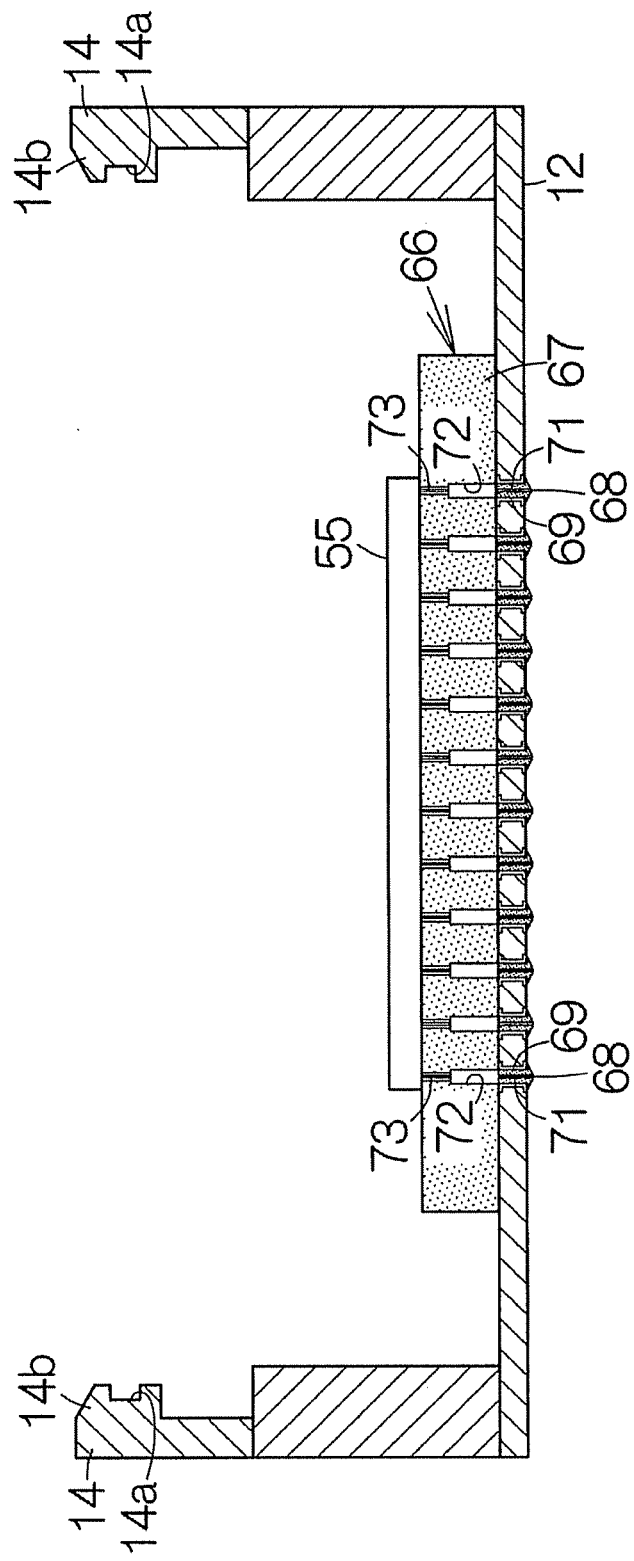
FIG. 14 is a cross sectional view schematically illustrating an appearance in which an LSI chip packaged is disposed on a socket.
Figure 15:
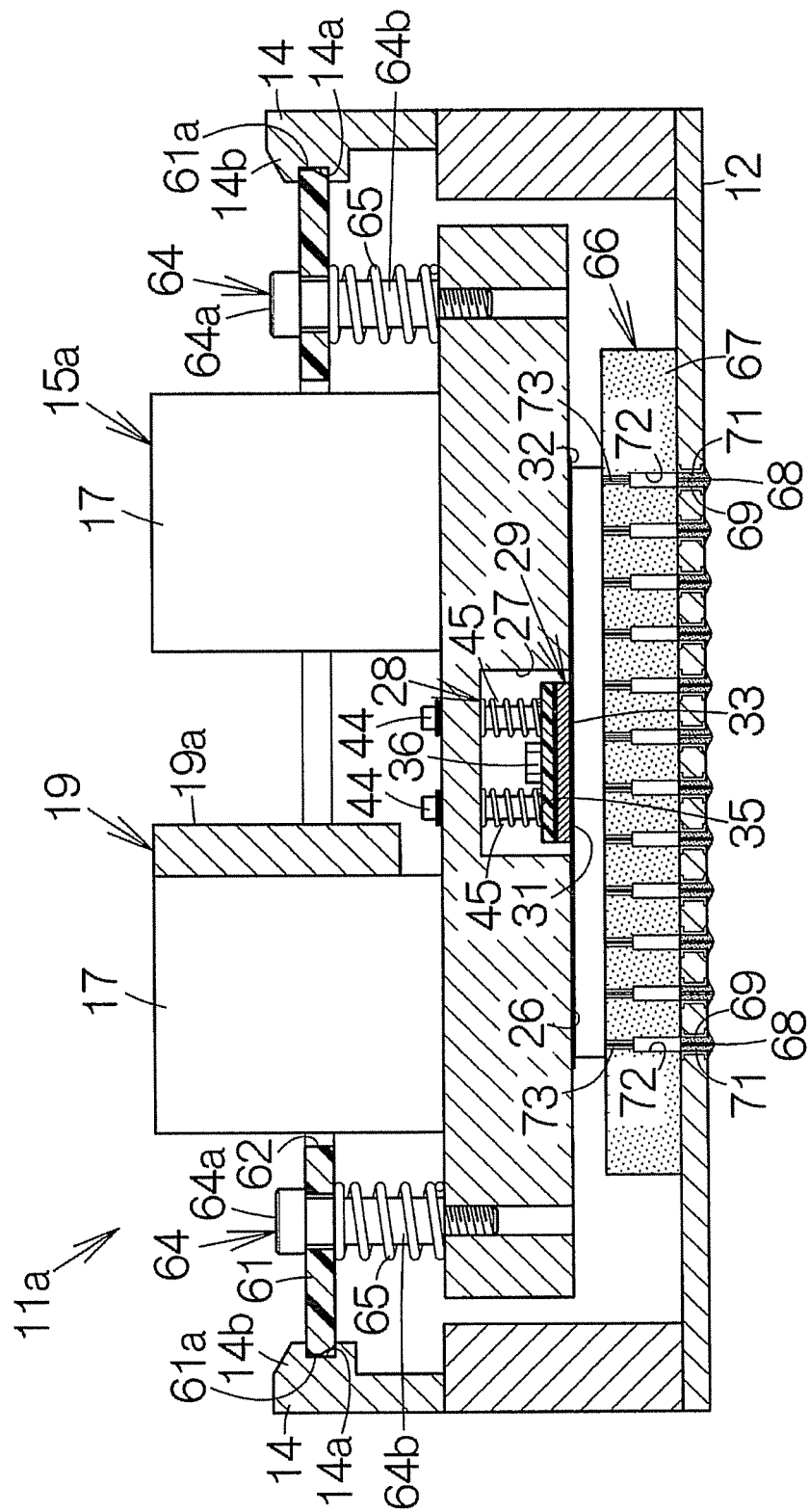
FIG. 15 is a cross sectional view schematically illustrating an appearance in which the heat sink is attached on a printed circuit board.

Referring to FIGS. 14 and 15, the temperature test of the LSI chip package will be explained. First, the attachment member 14 with the LSI chip package 55 mounted on the socket 66 is prepared as illustrated in FIG. 14, where the heat sink 15a is detached from the attachment member 14. As illustrated in FIG. 14, a plurality of terminal pins 73 are arranged in a matrix manner on the bottom surface of the LSI chip package 55. The terminal pins 73 are inserted in the respective through-holes 72 of the socket 66 for attaching the LSI chip package 55. Each of the terminal pins 73 is electrically connected to each of the terminal pins 68 in the respective through-hole 72 by the operation of a lock mechanism (not depicted) of the socket 66. In this manner, the LSI chip package 55 is connected to the printed circuit board 12 via the socket 66.

Next the heat sink 15a is attached on the printed circuit board 12 as illustrated in FIG. 15. When attaching the heat sink 15a, cutouts 61a formed at both ends of the plate 61 are pressed to the claws 14b of the attachment members 14. Further pressing the plate 61 toward the printed circuit board 12, the attachment members 14 are elastically deformed in the direction away from each other similarly to the aforementioned case. As a result, the both ends of the plate 61 are received in the respective cutouts 14a of the attachment members 14. When the attachment members 14 return to the original shapes or the original positions, the claws 14b of the attachment member 14 are received on the faces of the plate 61. In this manner, the heat sink 15a is attached to the attachment member 14.

The heat sink 15a is pressed on the surface of the LSI chip package 55 at the contact face 26 of the radiator plate 16 and the light receiving face 31 of the heat receiving plate 29. Since the radiator plate 16 is pushed up in the direction away from the face of the printed circuit board 12, the radiator plate 16 comes close to the plate 61. Accordingly, the contact face 26 of the radiator plate 16 is pressed on the surface of the LSI chip package 55 by the operation of the elastic force of the coil springs 65. At the same time, the heat receiving plate 29 is pushed up in the direction away from the face of the printed circuit board 12. As a result, the heat receiving plate 29 is positioned at the face side of the plane P. The heat receiving plate 29 overlaps the plane P, that is, the contact face 26. The coil spring 45 operates an elastic force for displacing the heat-receiving surface 31 from the front side of the plane P to the reverse side thereof, that is, to the surface of the LSI chip package 55.

When setting the constant of spring of the coil spring 45, similarly to the aforementioned first embodiment, the thickness of the LSI chip package 55 is considered. When the LSI chip package 55 having the maximum thickness among test targets is sandwiched between the heat sink 15a and the socket 13a, the spring constant is set so that the pressing force operating on the surface of the LSI chip package 55 from the heat-receiving surface 31 becomes equal to the pressing force operating on the surface of the LSI chip package 55 from the contact face 26. As a result, even when the thickness of the LSI chip package 55 is reduced from the maximum thickness, the pressing force of the heat-receiving surface 31 is always kept at a constant value. Regardless of change thickness of the LSI chip package 55, a constant thermal resistance is always established between the heat-receiving surface 31 and the LSI chip package 55.

In the temperature testing device 11a, similarly to the aforementioned temperature testing device 11, a temperature test of the LSI chip package 55 is executed. The heat sink 15a is received on the contact face 26 of the radiator plate 16 and the heat-receiving surface 31 of the heat receiving plate 29. The heat energy of the LSI chip package 55 is conducted to the radiator plate 16 from the contact face 26. The heat energy is radiated to the air from the fins 17. In this manner, the LSI chip package 55 is cooled. At the same time, the heat energy of the LSI chip package 55 is conducted to the heat receiving plate 29 from the heat-receiving surface 31. Since the heat-receiving surface 31 is separated from the contact face 26, the heat energy of the LSI chip package 55 is effectively conducted to the thermistor 36. The thermistor 36 may detect the temperature of the LSI chip package 55 with a high accuracy.

Figure 16:
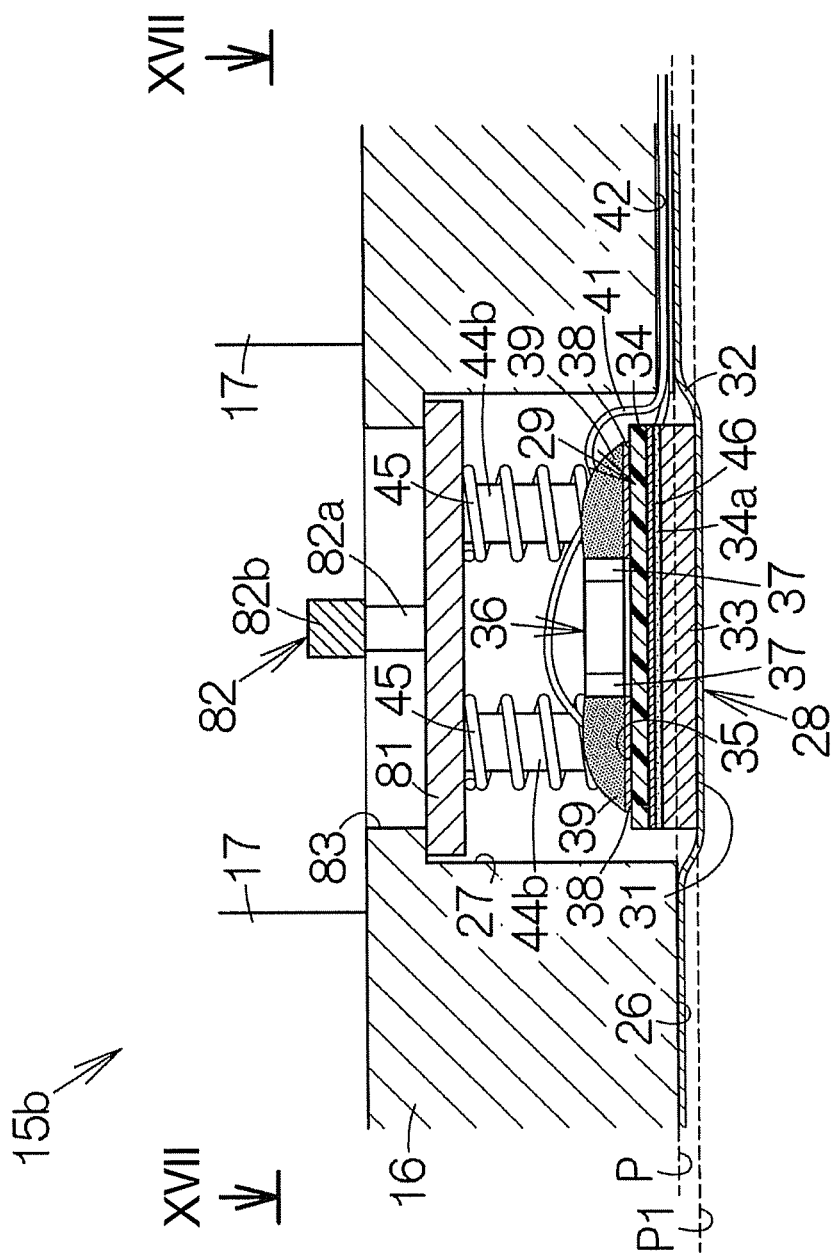
FIG. 16 is a partial enlarged cross sectional view schematically illustrating a temperature testing device according to still another concrete example.

FIG. 16 is a diagram schematically illustrating the structure of a heat sink 15b according to a third embodiment of the invention. In the heat sink 15b, the temperature detection unit 28 is attached to the radiator plate 16 in a detachable manner. The temperature detection unit 28 is equipped with a support plate 81 made of, for example, a resin supporting the shaft 44b of the bolt 44. The support plate 81 spreads in parallel with the plane P. The support plate 81 is received on the bottom face of the recess 27. An engage member 82 is coupled with the support plate 81 in a rotatable manner about a rotation shaft perpendicular to the face of the support plate 81. The engage member 82 is equipped with a shaft 82a rising from the face of the support plate 81, and an engage part 82b coupled to the shaft 82a.

Figure 17:
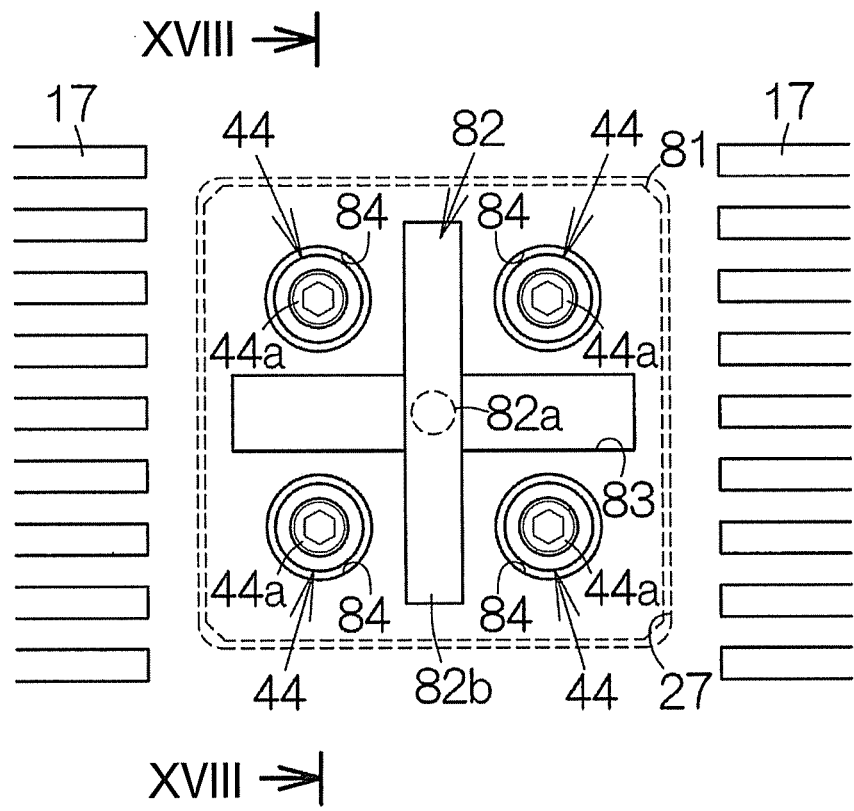
FIG. 17 is a partial enlarged cross sectional view taken along the line XVII-XVII of FIG. 16.
Figure 18:
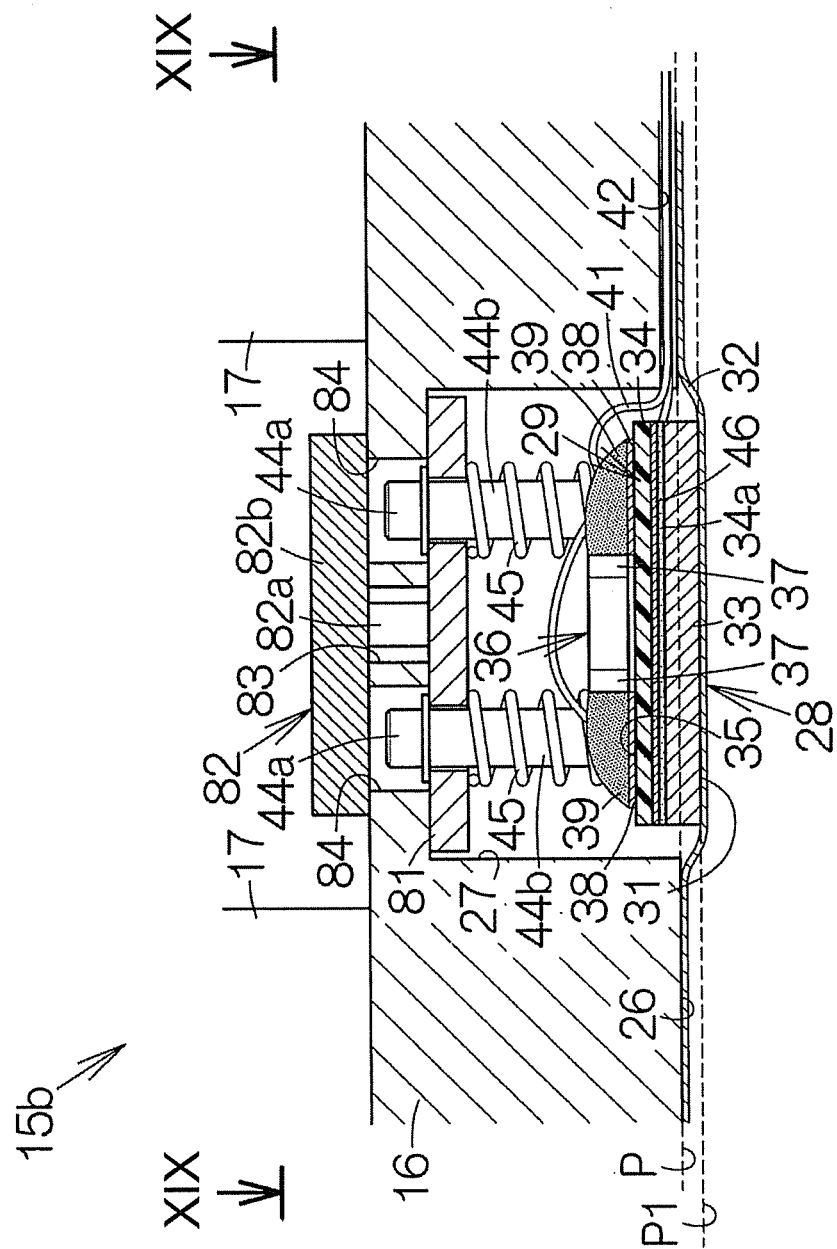
FIG. 18 is a cross sectional view taken along the line XVIII-XVIII of FIG. 17.

In conjunction with FIG. 17, the shaft 82a is disposed in a through-hole 83 formed on the radiator plate 16. The through-hole 83 extends, for example, in the width direction of the radiator plate 16 to be spindly shaped. The engage part 82b extends, for example, in the back and forth direction of the radiator plate to be spindly shaped. The both ends of the engage part 82b are supported on the face of the radiator plate 16 outside the outline of the through-hole 83. In conjunction with FIG. 18, the heads 44a of the bolts 44 are received on the face of the support plate 81. The head 44a of the bolt 44 is received in a through-hole 84 formed on the radiator plate 16. Protrusion of the head 44a from the face of the radiator plate 16 is prevented. The head 44a is disposed at a position closer to the printed circuit board 12 than a rotation pathway of the engage part 82b. In addition, the same reference numeral is used to denote the same constitution and structure as those of the aforementioned heat sinks 15, 15a.

Figure 19:
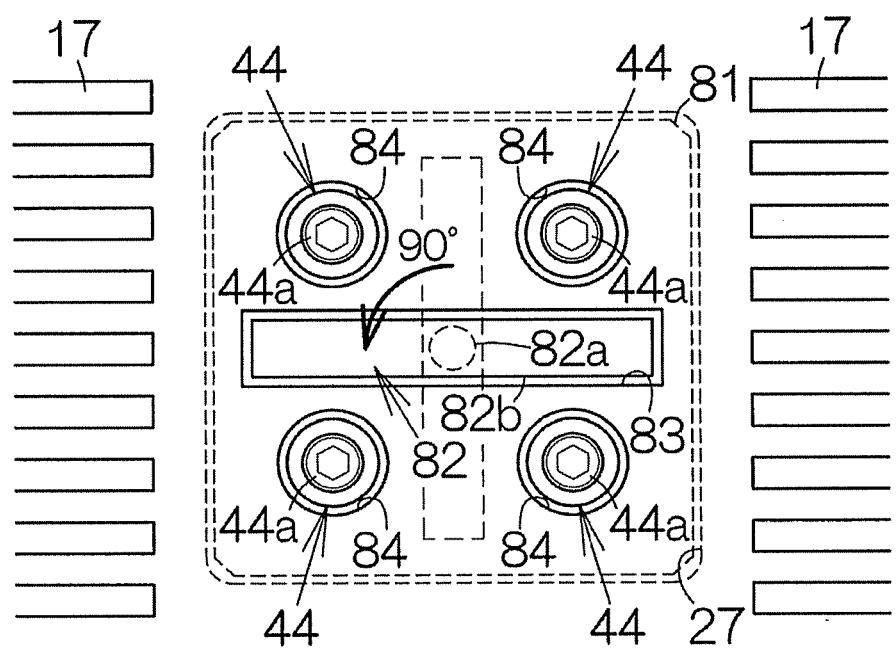
FIG. 19 is a partial enlarged cross sectional view schematically illustrating an appearance in which a temperature detection unit is detached.

As illustrated in FIG. 19, when detaching the temperature detection unit 28, when the engage part 82b is rotated by 90 degrees about the shaft 82a, the engage part 82b extends in the same direction as the through-hole 83. In this manner, the engage part 82b is disposed in the outline of the through-hole 83. At the time, when the engage part 82b is received in the through-hole 83, the temperature detection unit 28 is detached from the radiator plate 16. Note that when attaching the temperature detection unit 28, the inverse operation as the aforementioned detaching operation may be executed. According to the heat sink 15b, the same effects as those of the aforementioned embodiments can be provided. In addition, the temperature detection unit 28 can be simply exchanged when, for example, adjusting the coil spring 45.

Figure 20:
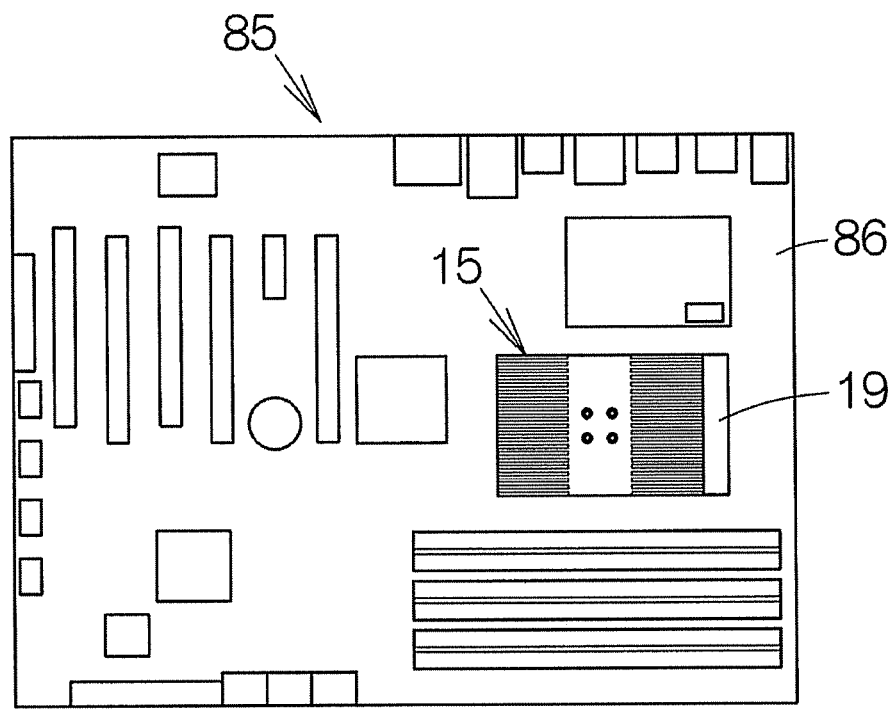
FIG. 20 is a plan view schematically illustrating an appearance in which a heat sink is embedded in a mother board.
Figure 21:
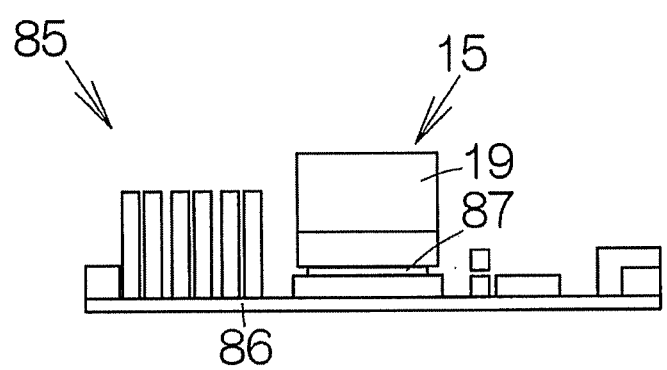
FIG. 21 is a side view schematically illustrating an appearance in which the heat sink is embedded in the mother board.

As illustrated in FIG. 20, the heat sinks 15 to 15b may be independently embedded in a print substrate unit such as a motherboard 85. The mother board 85 is embedded in an electronic apparatus such as, for example, a server computer. The mother board 85 is equipped with a print substrate 86. In conjunction with FIG. 21, for example, the heat sink 15 is disposed on an LSI chip package 87 on the print substrate 86. When disposing the heat sink 15, for example, an attachment member (not depicted) rising from the face of the print substrate 86 may be used. A control circuit (not depicted) on the print substrate 86 is connected to the thermistor 36 and the fan unit 19 on the heat sink 15. The aforementioned temperature test is executed based on the control of the control circuit. In this manner, the heat sinks 15 to 15b of the invention are used for executing a temperature test of the mother board 85 already embedded in an electronic apparatus.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A heat sink for measuring a temperature of an electronic component, comprising:
    a heat radiating plate having a first surface that receives heat from the electronic component;
    a fin that connects to the heat radiating plate, and that radiates heat energy conducting through the heat radiating plate;
    a heat receiving plate arranged apart from the heat radiating plate and having first and second surfaces movable to be parallel to the surface of the heat radiating plate; and
    a temperature detector that detects a temperature and that is disposed on the heat receiving plate,
    wherein, at least a portion of the first surface of the heat radiating plate and at least a portion of the second surface of the heat receiving plate are capable of contacting at least a portion of a first surface of the electronic component.

2. The heat sink according to claim 1, further comprising a metal plate on the first surface of the heat receiving plate and a substrate that supports the temperature detector,
    wherein the substrate is disposed on the metal plate and includes a plurality of through holes that penetrate between an upper surface and a lower surface of the substrate.

3. The heat sink according to claim 2, wherein a space between the first surface of the heat receiving plate on which the temperature detector is mounted and a wall of the heat radiating plate forms an air chamber.

4. The heat sink according to claim 1, further comprising a coupling mechanism that supports the heat receiving plate and allows a displacement of the heat receiving plate to move in the direction orthogonal to the second surface of the heat receiving plate and outside of the heat radiating plate.

5. The heat sink according to claim 4, wherein the coupling mechanism includes an elastic member that activates to displace the heat receiving plate.

6. The heat sink according to claim 4, wherein the coupling mechanism includes a regulation mechanism that regulates an amount of the displacement.

7. A heat sink for measuring a temperature of an electronic component, the heat sink comprising:
    a heat radiating plate that receives heat from the electronic component;
    a fin that connects to the heat radiating plate, and that radiates heat energy conducted by the heat radiating plate;
    a heat receiving plate arranged apart from the heat radiating plate; and
    a temperature detector disposed on the heat receiving plate,
    wherein at least a portion of a surface of the heat radiating plate and at least a portion of a surface of the heat receiving plate are capable of contacting at least a portion of a first surface of the electronic component.

8. A heat sink for measuring a temperature of an electronic component, comprising:
    a heat radiating plate having a first surface that receives heat from the electronic component;
    a fin that connects to the heat radiating plate, and that radiates heat energy conducting through the heat radiating plate;
    a heat receiving plate arranged apart from the heat radiating plate and having first and second surfaces movable to be parallel to the surface of the heat radiating plate; and
    a temperature detector that detects a temperature and that is disposed on the heat receiving plate,
    wherein at least a portion of the first surface of the heat radiating plate and at least a portion of the second surface of the heat receiving plate are capable of contacting at least a portion of the same surface of the electronic component.

* * * * *